United States Patent
Rangarajan et al.

(10) Patent No.: US 9,544,041 B2
(45) Date of Patent: Jan. 10, 2017

(54) INDEPENDENT AND CONCURRENT AUTOMATIC GAIN CONTROL FOR WIRELESS COMMUNICATION AND SPECTRAL INTELLIGENCE

(71) Applicant: Cisco Technology, Inc., San Jose, CA (US)

(72) Inventors: Raghuram Rangarajan, Santa Clara, CA (US); David Kloper, Santa Clara, CA (US); Paul J. Stager, Akron, OH (US)

(73) Assignee: Cisco Technology, Inc., San Jose, CA (US)

( * ) Notice: Subject to any disclaimer, the term of this patent is extended or adjusted under 35 U.S.C. 154(b) by 596 days.

(21) Appl. No.: 13/973,496

(22) Filed: Aug. 22, 2013

(65) Prior Publication Data

US 2015/0056936 A1   Feb. 26, 2015

(51) Int. Cl.
| | | |
|---|---|---|
| H04M 1/00 | (2006.01) | |
| H04B 7/08 | (2006.01) | |
| H03G 3/30 | (2006.01) | |

(52) U.S. Cl.
CPC .......... *H04B 7/0817* (2013.01); *H03G 3/3078* (2013.01)

(58) Field of Classification Search
CPC .................................................. H04B 7/0817
USPC ..... 455/552.1, 553.1, 132–141, 232.1–253.2
See application file for complete search history.

(56) References Cited

U.S. PATENT DOCUMENTS

| | | | | |
|---|---|---|---|---|
| 6,954,446 B2 * | 10/2005 | Kuffner | .................. | H04B 1/005 370/335 |
| 7,277,685 B2 * | 10/2007 | Liu | ....................... | H04L 25/022 375/345 |
| 7,450,533 B2 * | 11/2008 | Aoki | .................... | H04L 25/0224 370/208 |
| 7,512,083 B2 * | 3/2009 | Li | ........................ | H04B 7/0837 370/265 |
| 7,515,929 B2 * | 4/2009 | Ramachandran | .... | H04B 1/0067 455/168.1 |

(Continued)

OTHER PUBLICATIONS

International Search Report and Written Opinion in counterpart International Application No. PCT/US2014/051047, mailed Dec. 12, 2014, 10 pages.

(Continued)

*Primary Examiner* — Edward Urban
*Assistant Examiner* — Rui Hu
(74) *Attorney, Agent, or Firm* — Edell, Shapiro & Finnan, LLC

(57) ABSTRACT

A set of receiver path circuits is allocated for processing a radio-frequency (RF) signal provided by receive antennas coupled to the receiver path circuits. The RF signal may belong to a first signal class, such as Wi-Fi. A first gain control signal is applied to each of the allocated receiver path circuits to condition a signal level of the RF signal for the first signal class. A second gain control signal is applied to another set of receiver path circuits coupled to the receive antennas to condition the RF signal of a second signal class. First receive gain control signals are generated from the RF signals of the first signal class by the allocated set of the receiver path circuits. The first receive gain control signals are configured to optimize the signal level for processing the first signal class. A second receive gain control signal is generated to optimize the signal level of the RF signal for the second signal class.

18 Claims, 6 Drawing Sheets

(56) References Cited

U.S. PATENT DOCUMENTS

| | | | | |
|---|---|---|---|---|
| 7,519,128 B2* | 4/2009 | Seto | ............................ | H04L 1/06 375/260 |
| 7,583,746 B2* | 9/2009 | Aoki | ..................... | H03G 3/3052 370/334 |
| 7,672,689 B2* | 3/2010 | Khlat | ....................... | H04B 1/30 455/324 |
| 7,783,958 B1 | 8/2010 | Eidson et al. | | |
| 7,856,068 B1* | 12/2010 | Tung | ................... | H04L 25/0232 370/334 |
| 7,885,607 B1* | 2/2011 | Narasimhan | ........... | H04L 1/0001 455/135 |
| 7,890,078 B2* | 2/2011 | Kluge | .................. | H04B 1/0071 370/316 |
| 7,920,526 B2* | 4/2011 | Hansen | ................. | H04L 5/0023 370/319 |
| 7,991,430 B2* | 8/2011 | Bagchi | ................ | H04L 27/0012 370/338 |
| 8,054,779 B2* | 11/2011 | Hassan | ................... | H04W 8/22 370/203 |
| 8,086,199 B2 | 12/2011 | Kloper et al. | | |
| 8,194,771 B2* | 6/2012 | Hammerschmidt | . | H04B 7/0671 370/334 |
| 8,345,786 B2* | 1/2013 | Hwang | ................. | H04L 1/0618 375/259 |
| 8,396,102 B2* | 3/2013 | Cheong | ..................... | H04B 1/40 370/272 |
| 8,682,274 B2* | 3/2014 | Sultenfuss | ............. | H04W 52/42 455/132 |
| 8,798,552 B2* | 8/2014 | Brobston | .................. | H04B 1/38 455/132 |
| 8,811,537 B2* | 8/2014 | Lee | ....................... | H04B 1/1036 375/317 |
| 8,995,591 B2* | 3/2015 | Gudem | ................. | H04L 5/0098 375/219 |
| 9,001,809 B2* | 4/2015 | Lea | ......................... | H01Q 21/24 370/310 |
| 9,172,402 B2* | 10/2015 | Gudem | ................. | H04B 1/0057 |
| 9,226,267 B2* | 12/2015 | Warner | ................ | H04B 7/0608 |
| 2005/0163081 A1* | 7/2005 | Aoki | ..................... | H03G 3/3052 370/334 |
| 2005/0202842 A1* | 9/2005 | Brobston | ................ | H04B 1/006 455/552.1 |
| 2006/0034389 A1* | 2/2006 | Aoki | ..................... | H04W 52/52 375/299 |
| 2006/0068854 A1* | 3/2006 | Sandhu | ................. | H04B 7/0874 455/574 |
| 2006/0099925 A1* | 5/2006 | Tsai | ..................... | H04B 7/0842 455/272 |
| 2006/0270364 A1* | 11/2006 | Aoki | ..................... | H04B 7/0671 455/101 |
| 2006/0274867 A1* | 12/2006 | Nagata | ................. | H04B 7/0817 375/347 |
| 2007/0207752 A1 | 9/2007 | Behzad | | |
| 2007/0243832 A1* | 10/2007 | Park | ....................... | H04B 1/006 455/73 |
| 2009/0232100 A1* | 9/2009 | Faber | ................... | H04B 7/0817 370/334 |
| 2009/0285185 A1* | 11/2009 | Hansen | ................. | H04L 5/0023 370/334 |
| 2011/0299510 A1* | 12/2011 | Kim | ....................... | H04B 1/406 370/338 |
| 2012/0314583 A1 | 12/2012 | Hart et al. | | |
| 2013/0244722 A1* | 9/2013 | Rousu | ................... | H04B 1/0057 455/552.1 |

OTHER PUBLICATIONS

Cisco, "Wireless LAN Design Guide for High Density Client Environments in Higher Education," retrieved from http://www.cisco.com/web/strategy/docs/education/cisco_wlan_design_guide.pdf, on Aug. 22, 2013, 40 pages.

Cisco, "Cisco CleanAir Technology," retrieved from http://www.cisco.com/en/US/solutions/collateral/ns340/ns394/ns348/ns1070/aag_c22-594304.pdf, on Aug. 22, 2013, 4 pages.

Cisco, "Cisco CleanAir Technology: Intelligence in Action," White Paper, retrieved from http://www.cisco.com/en/US/solutions/collateral/ns340/ns394/ns348/ns1070/white_paper_c11-599260.html, on Aug. 22, 2013, 10 pages.

* cited by examiner

US 9,544,041 B2

INDEPENDENT AND CONCURRENT AUTOMATIC GAIN CONTROL FOR WIRELESS COMMUNICATION AND SPECTRAL INTELLIGENCE

TECHNICAL FIELD

The present disclosure relates to automatic gain control in wireless communication receivers.

BACKGROUND

Extraordinary growth in mobile business and personal telecommunications over the past decade has driven design efforts for more efficient radio-frequency (RF) spectral utilization and higher data throughput. Wireless local area network (WLAN) technology has undergone so many improvements that the Institute for Electrical and Electronic Engineering (IEEE), which maintains the widely used 802.11 standards, commercially known (and referred to herein) as Wi-Fi™, has had to resort to recycling the alphabet for extending their revision tracking convention. As of the filing of the present application, IEEE 802.11ac is in its late draft stages and standardizes highly anticipated improvements, including, but not limited to wider bandwidth, higher data rates and multi-user (MU) multiple-input/multiple-output (MIMO).

Wider bandwidth, however, carries with it additional challenges in receiver implementation. For example, IEEE 802.11ac specifies a 5 GHz bandwidth that encompasses the RF band for, among other things, certain radar systems. When radar signals are present, Wi-Fi transmitters are prohibited from transmitting in the same band and, accordingly, many equipment manufactures implement Dynamic Frequency Selection (DFS) by which, upon detecting a radar signature in channels through which certain devices are communicating, DFS-enabled equipment can be switched to alternative channels. DFS implementations seek to utilize as much bandwidth as possible and thus a great deal of effort has been devoted toward spectral intelligence (SI) techniques that can accurately identify the presence of different types of signals. For example, if true radar emissions can be discriminated from signals that resemble radar, such as by electromagnetic radiation other than radar that occupies the same band, false reporting of the presence of radar can be averted. In the absence of true radar, a network node may be free to use that portion of its bandwidth that would otherwise be excluded by the false reporting. SI is also being used to identify RF interference in the Wi-Fi band so that its impact can be mitigated, such as by selecting an alternative channel on which to communicate. Microwave ovens, cordless phones, RF jammers, motion detectors, neighboring wireless networks, and wireless security cameras are just a few sources of interference that can severely impact performance of a wireless network. Advanced SI techniques can now identify the source of interference and locate the source on a map. Network management processes can report that location to responsible parties and make automatic adjustments to optimize wireless coverage while the interference remains active.

While implementing SI on Wi-Fi equipment offers many advantages, optimizing the radio receiver for both signal analysis and Wi-Fi communications is key in achieving its maximum benefit. For example, automatic gain control (AGC) for optimal Wi-Fi signal processing is not conducive to optimal SI. Current technologies attempt to apply a common AGC mechanism for all signal processing modes, but as the requirements of Wi-Fi become more demanding, such compromise is no longer a viable solution.

DESCRIPTION OF EXAMPLE EMBODIMENTS

Overview

Presented herein are techniques for independent and concurrent automatic gain control for wireless communications and spectral intelligence. A plurality of receiver path circuits is coupled to one or more receive antennas of a wireless receiver. A first set of receiver path circuits is allocated for processing a radio-frequency (RF) signal from the receive antennas into a first receive signal of a first signal class. A first gain control signal is applied to each of the allocated receiver path circuits to condition a signal level of the RF signal for its processing into the first receive signal. A second gain control signal is applied to a second set of receiver path circuits to condition the signal level of the RF signal for its processing into a second receive signal of a second signal class distinct from the first signal class. The receiver path circuits are reallocated in response to a determination from either of the first and second receive signals that a corresponding one of the first and second signal classes is a communication signal belonging to a wireless communication signal class associated with a wireless network protocol. The corresponding first or second gain control signal applied to the reallocated receiver path circuits is modified to optimize the signal level of the RF signal for its processing into the communication signal.

Example Embodiments

Figure 1:
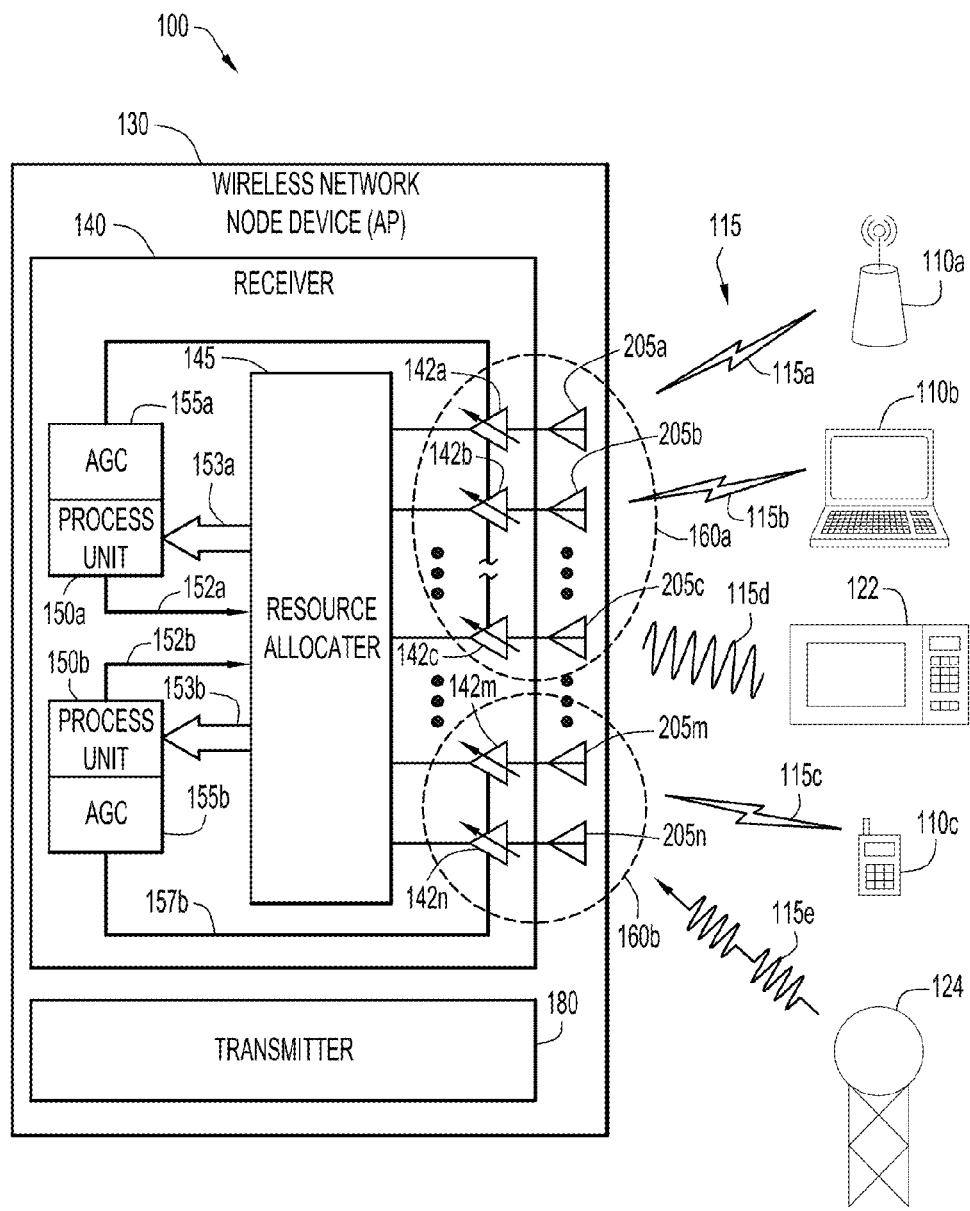
FIG. 1 is a diagram of an example wireless network in which independent and concurrent AGC can be embodied.

FIG. 1 is a diagram of an example wireless local area network (WLAN) 100 in which the subject techniques are implemented. WLAN 100 operates under well-understood physical signaling interfaces and communication protocols by which compliant wireless network node devices can communicate and interoperate. It is to be understood that while the subject technique of this disclosure is presented in a WLAN context, the skilled artisan will recognize other configurations in which the technique can be implemented, including wireless wide area networks (WWANs), wireless personal area networks (WPANs), and so on.

In the example illustrated in FIG. 1, WLAN 100 communicatively links network node devices 110*a*-110*c*, representatively referred to herein simply as node device(s) 110, which may include access points (APs) 110*a*, and client devices including computers 110*b* and cellular telephones 110c, to name but a few of the many types of wireless communication devices that can participate in WLAN 100. Node devices 110 may have respective radio and data processing resources that are to varying degrees different from other node devices 110 and yet all can communicate through WLAN 100 to the extent allowed by those resources on the device if that device adheres to the network protocols of WLAN 100.

WLAN 100 may include one or more wireless network node devices 130 that may be configured to support a number of signaling procedures and protocols and, in certain configurations, facilitate communications between diverse node devices 110, such as an access point (AP) or router. In WLAN 100, such a node device is exemplified by wireless network node device 130, which will be referred to herein as AP 130. However, it is to be understood that the subject technique of this disclosure is not limited to access point or router implementations; the methodologies disclosed herein are applicable to other wireless devices and protocols.

AP 130 may include an array of N antennas 205a-205e, representatively referred to herein as antenna(s) 205, a receiver 140 and a transmitter 180. In certain embodiments, antennas 205 are shared by both receiver 140 and transmitter 180, in which case suitable isolation circuits may be used to isolate receiver 140 from transmitter 180 during transmission and, typically, vice-versa. However, it is to be understood that the subject technique can be practiced independently of how and even whether transmitter 180 is implemented in a wireless network node device. Transmitter 180 can thus be constructed in any suitable manner and will not be discussed in particular detail in this disclosure.

At any given point in time, electromagnetic radiation 115 impinges antennas 205, where such electromagnetic radiation 115 may include RF radiation 115a-115c emitted from node devices 110a-110c, respectively, RF radiation 115d from an interference source such as microwave oven 122, RF radiation 115e from weather radar apparatus 120, and or radiation corresponding to interference from communication signals that are non-compliant with the protocols of WLAN 100 and white background radiation. The electromagnetic radiation 115 impinging each antenna 205 is converted into an RF electrical signal that can be conveyed through signal processing circuitry. The resulting RF signals are provided to a corresponding receiver circuit 142a-142e, representatively referred to herein as receiver circuit(s) 142, coupled to respective antennas 205, where they are down-converted to a baseband frequency. The baseband signals are then provided to one or more processing units 150a-150b, representatively referred to herein as processing unit(s) 150, by which the raw baseband data are further processed, such as to extract information, to generate control signals, transformed into another signal domain, and so on. The subject techniques are not limited to particular functionality of processing units 150, although, in a wireless network application such as that described herein, at least one of the processing units 150 will perform network-related processing on raw receiver data produced by receiver circuits 142. In certain embodiments, one or more processing units 150 may implement analysis techniques for characterizing other constituents of electromagnetic radiation 115, such as interference radiation 115d and 115e.

Receiver circuits 142 may be individually and independently controlled to condition the RF signals from the antennas 205 in accordance with requirements of later processing. Accordingly, each receiver circuit 142 may incorporate one or more variable gain stages, tunable filters, tunable downconversion stages, etc., each being controlled by suitable control signals being applied thereto.

Receiver 140 may include a receiver resource allocator 145 that configures circuit paths for connection from a certain number of receiver circuits 142 and corresponding connected antennas 205, as illustrated by receiver circuit group 160a, to processing unit 150a, and from a certain number of receiver circuits 142 and corresponding connected antennas 205, as illustrated by receiver circuit group 160b, to processing unit 150b. Thus, each processing unit 150 receives a set of receive signals 153a, 153b, representatively referred to herein as receive signal(s) 153, and can perform its designated processing concurrently with the processing of other processing units 150 on other sets of receive signals 153. The allocation of receiver circuits for each processing unit 150 may be based on application specific criteria. In certain embodiments, the receiver resource requirements of processing units 150 may be based on signal classes of RF signals in the electromagnetic radiation 115. For example, when RF signals corresponding to wireless communication links 115a-115c, one or more processing units 150 may detect such a signal class and provide an indication of such to resource allocator 145, as indicated by signals 152a-152b, representatively referred to herein as allocation signals 152. One or more processing units 150 may be configured to process such communication signals. On the other hand, if RF signals are in radiation 115d and/or 115e, one or more processing units 150 may detect such signal classes and provide an indication of such to resource allocator 145 on allocation signals 152. One or more processing units 150 may be dedicated to processing signals of these signal classes. Accordingly, a certain number of receiver circuits 142 can be allocated for processing communication signals and another number of receiver circuits 142 can be allocated for processing other signals, such as for spectral intelligence purposes. It is to be understood that such allocation may be dynamic; receiver circuits 142 can be reallocated as needed, such as to improve signal quality for demodulation, to perform channel sounding for purposes of beamforming, and for other purposes as will be recognized and appreciated by the skilled artisan upon review of this disclosure.

Additionally, each processing unit 150 may have an automatic gain control (AGC) circuit 155a, 155b, for configuring the receiver circuits 142 in the receiver circuit groups 160a, 160b for which it has been allocated. Thus, for example, the receiver circuits 142 in receiver circuit group 160a may be allocated for use by processing unit 150a and resource allocator 145 may provide signals 153a to processing unit 150a from receiver circuits 142 in receiver circuit group 160a. Similarly, the receiver circuits 142 in receiver circuit group 160b may be allocated for use by processing unit 150b and resource allocator 145 may provide signals 153b to processing unit 150b from receiver circuits 142 in receiver circuit group 160b. Meanwhile, AGC circuit 155a is given complete and independent gain control over receiver circuits 142 in receiver circuit group 160a and AGC circuit 155b is given complete and independent gain control over receiver circuits 142 in receiver circuit group 160b. Each receiver circuit 142 is thus contained in a separate and distinct gain control loop that may be controlled in a common scheme with other gain control loops within a certain receiver circuit group 160. It is to be understood that the receiver circuits 142 that are members of an allocated receiver circuit group 160 need not be controlled identically; a gain control scheme between member receiver circuits 142 may establish different gain characteristics to achieve a particular objective, such as individually maximizing signal-to-noise ration (SNR) through each path.

Figure 2:
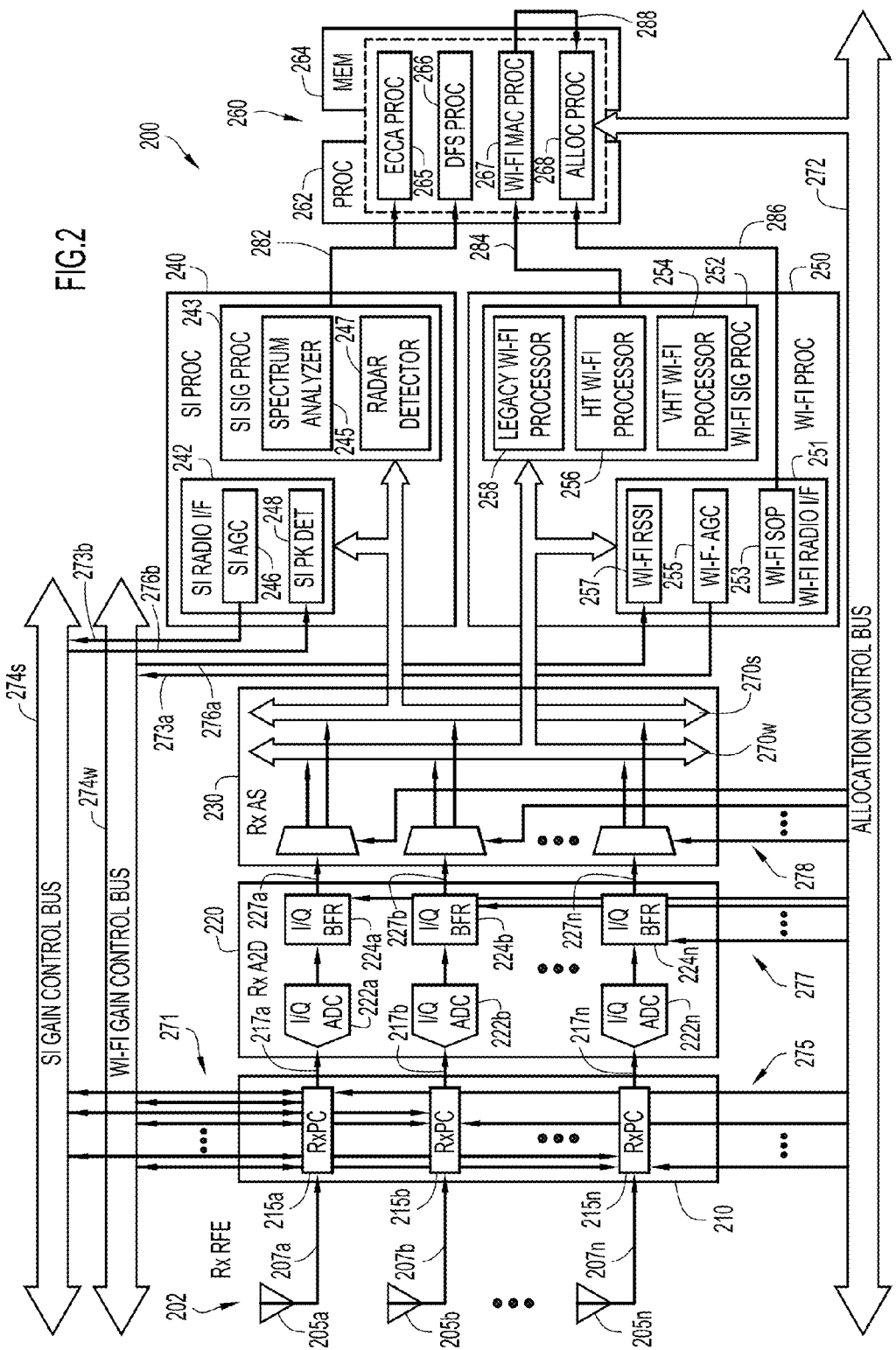
FIG. 2 is a schematic block diagram of an example receiver circuit in which independent and concurrent AGC can be embodied.

FIG. 2 is a schematic block diagram of a receiver circuit 200 by which the subject technique of this disclosure can be embodied in a wireless network node device, such as wireless network node device 130 in FIG. 1. It is to be understood that FIG. 2 is not an electrical schematic, but rather a functional diagram for purposes of describing the technique in a typical setting, which, in this example, may be a Wi-Fi access point. The various functional components and signal paths in FIG. 2 are illustrated for purposes of explaining the technique and are not intended to represent direct electrical connections. Additionally, the functional divisions illustrated and described herein are not necessarily those that would occur in a physical realization; many functional divisions can fulfill equivalent or similar operations as those described herein, as will be recognized and appreciated by the skilled artisan.

In overview, example receiver circuit 200, which, for purposes of description, is to be considered as forming part of receiver 140 in FIG. 1, is constructed to receive and process electromagnetic energy into Wi-Fi compliant baseband data and/or data from which non-Wi-Fi signals can be characterized or identified. To that end, receiver circuit 200 may incorporate an antenna array 202, a receiver radio front end (RxRFE) 220, a receiver analog-to-digital stage (RxA2D) 230, a spectral intelligence (SI) processor 240, a Wi-Fi processor 250 and a processor platform 260, all of which are described in detail below. It is to be understood, however, that processing capabilities other than SI processor 240 and Wi-Fi processor 250 may be incorporated as well and resources may be allocated, as available, to such other processing capabilities in the manner described below. The technique described herein is not limited to a particular set of processes for which independent AGC may be established.

In operation, receiver circuit 200 classifies RF signals produced from the aforementioned electromagnetic energy and, based on that classification, allocates receiver resources to SI processor 240, Wi-Fi processor 250 or both. As used herein, a receiver resource is said to be allocated to a target process when that process controls receiver resource's gain. That is, each target process performs automatic gain control (AGC) for those receiver resources to which it has been allocated. The allocation and AGC processes are executed continuously so that receiver resources are properly conditioned for the signal classes being received.

Referring first to the back-end of receiver circuit 200, processing platform 260 represents a programmable computing platform on which any of the processes described herein can be realized. That is, while many of the processes are illustrated and described herein as separate and distinct from processing platform 260, such is solely for purposes of explanation. While certain embodiments may have dedicated circuitry for certain operations of receiver circuit 200, other embodiments may realize the same or similar operations through suitably-programmed processing instructions stored in memory 264 and executing on processor 262.

Processing platform 260 is illustrated as executing an enhanced clear channel assessment (eCCA) process 265, a dynamic frequency selection (DFS) process 266, a Wi-Fi media access control (MAC) process 267 and an allocation process 268, any or all of which may be implemented by fixed circuitry as well. eCCA process 265 is an abstraction of any methodology that augments typical Wi-Fi CCA that relies on signal or power level thresholds by spectral intelligence, i.e., analyzing, classifying, identifying, etc., electromagnetic radiation about wireless network node device 130. DFS process 266 performs a similar function, albeit for reasons of avoiding transmitting on a channel that is occupied by RF signals of a licensed user, e.g., radar. The subject technique of this disclosure does not require that these processes be implemented. However, eCCA process 265 and DFS process 266 are consumers of SI data, representatively illustrated at SI data signal 282, produced by SI processor 240. The technique described herein can improve the quality of SI data signal 282 and thus has an impact on the efficiency and accuracy of both eCCA process 265 and DFS process 266.

Memory 264 may comprise read only memory (ROM), random access memory (RAM), magnetic disk storage media devices, optical storage media devices, flash memory devices, electrical, optical, or other physical/tangible memory storage devices. Processor 262 is, for example, a microprocessor or microcontroller that executes instructions for the eCCA 265 logic, the DFS 266 logic, the MAC 267 logic and allocation process logic 268, as well as, in certain embodiments, any or all of the SI processor 240 logic and Wi-Fi processor 250 logic. Thus, in general, the memory 264 may comprise one or more tangible computer readable storage media (e.g., a memory device) encoded with software comprising computer executable instructions and when the software is executed (by the processor 262) it is operable to perform the operations described herein in connection with eCCA 265 logic, the DFS 266 logic, the MAC 267 logic, allocation 268 logic, SI AGC 246 logic, SI peak detection 248 logic, spectrum analyzer 245 logic, radar detector 247 logic, Wi-Fi RSSI 257 logic, Wi-Fi AGC 255 logic, Wi-Fi SOP 253 logic and Wi-Fi signal processing 250 logic, the details of which are described hereinafter.

Wi-Fi MAC process 267 implements, among other things, a channel access scheme per one of many known multiple access protocols. The subject technique is not limited to a particular Wi-Fi MAC methodology; the technique operates seamlessly with various mechanisms including carrier sense multiple access with collision avoidance (CSMA/CA) and Wi-Fi request-to-send/clear-to-send (RTS/CTS) methods. Indeed, the subject technique of this disclosure operates within the realm of Wi-Fi physical layer (PHY) baseband and impacts the MAC layer only indirectly. That is, Wi-Fi MAC process 267 is a consumer of Wi-Fi data, representatively illustrated at Wi-Fi data signal 284, generated by Wi-Fi processor 250, and optionally, a consumer of data produced by eCCA process 265 and DFS process 266, and improvements in the quality of Wi-Fi data signal 284 (as well as the added functionality of eCCA process 265 and DFS process 266) by way of the present technique manifests itself as an improvement in operation of Wi-Fi MAC process 267.

Allocation process 268 is described in detail below, particularly with reference to FIG. 6. However, an overview of receiver resource allocation in view of the schematic block diagram of FIG. 2 is believed beneficial here. Allocation process 268 may receive an indication of a signal class of one or more RF signals 207 at receiver radio front end (RxRFE) 210. Example signal classes may include a non-communication signal class, a Wi-Fi signal class, a HT Wi-Fi signal class and a VHT Wi-Fi signal class, although the technique is not limited to just these few classes. The indication of the signal class may be provided to allocation process 268 by class identification signal 286. In response to class identification signal 286, allocation process 268 generates a set allocation signals and applies those signals onto allocation control bus 272. The allocation signals on allocation control bus 272 configure receiver allocation switch (RxAS) 230 to direct the output of a certain number of receiver circuits to SI processor 240 for use in spectral intelligence and to direct the output of the remaining receiver circuits to Wi-Fi processor 250 for Wi-Fi communication processing. Additionally, the allocation signals generated by allocation process 268 configure RxRFE 210 to receive gain control signals from an appropriate one of SI gain control bus 274s or Wi-Fi gain control bus 274w. Thus, each receiver circuit can be independently accessed by either of SI processor 240 or Wi-Fi processor 250 for raw receiver data and any gain adjustment that may be determined necessary based on that receiver data is applied by the target process, i.e., SI baseband processing by SI processor 240 or Wi-Fi baseband processing by Wi-Fi processor 250, receiving that receiver data, i.e., applied by the target process for which that receiver circuit was allocated.

As described above with reference to FIG. 1, receiver circuit 200 includes an antenna array 202 of N antennas 205. Antennas 205 are each electrically coupled to a corresponding receiver path circuit 215a-215n, representatively referred to herein as RxPC(s) 215, of receiver radio front end (RxRFE) 210. Antennas 205 provide RF signals 207a-207n, representatively referred to herein as RF signal(s) 207, to respective RxPCs 215, which are described in detail with reference to FIG. 3, which in turn produce analog baseband receive signals 217a-217n, representatively referred to herein as analog receive signal(s) 217. It is to be understood that while analog receive signals 217 are illustrated in FIG. 2 by a single line, a complete analog receive signal 217 may have multiple signal components carried on multiple signal conductors. For example, receive signals may be passed through an in-phase (I) and quadrature (Q) demodulator to extract I and Q signal components, although other signal variants are possible that do not decompose the signals into quadrature components.

Analog receive signals 217 may be converted into digital baseband receiver signals 227a-227n, representatively referred to herein as digital receive signal(s) 227, or simply receive signal(s) 227, by receiver analog-to-digital stage (RxA2D) 220. RxA2D 220 may include an analog-to-digital converter (ADC) 222a-222n, representatively referred to herein as ADC(s) 222, for each signal component of analog receive signal 217 produced by RxRFE 210. Additionally, RxA2D 220 may include a corresponding sample buffer 224a-224n, representatively referred to herein as buffer(s) 224, to store an arbitrary number of digital samples of receive signals 227.

RxA2D 220 may provide receive signals 227 to receiver allocation switch (RxAS) 230 by which each receive signal 227 is directed towards circuitry for further processing. In the present example, such processing is either SI processing by SI processor 240 or Wi-Fi processing by Wi-Fi processor 250, although it is to be understood that the subject technique of this disclosure can be practiced with any number of different processing circuits. In receiver circuit 200, the allocable resources are the separate receiver channel circuits comprising an antenna 205, an RxPC 215, an ADC 222 and a buffer 224 and the receive signal 227 detected through each such receiver channel is allocated to SI processor 240 or Wi-Fi processor 250 by a selecting an appropriate signal state on allocation signals 278 and providing such to RxAS 230. RxAS 230 may have suitable switching circuitry that, in response to allocation signals 278, place each receiver signal 227 on one of two busses: Wi-Fi signal bus 270w, which is electrically coupled to Wi-Fi processor 250 and electrically isolated from SI processor 240, and SI signal bus, which is electrically coupled to SI processor 240 and electrically isolated from Wi-Fi processor 250. Allocation signals 278 may be generated under system control, such as by allocation control process 268 described in more detail below. However, certain implementations may provide all receive signals 227 in parallel to both SI processor 240 and Wi-Fi processor 250, and each processor may identify and process only those receive signals 227 to which it is allocated. When so embodied, RxAS 230 may be excluded.

The Wi-Fi processor 250 implements circuitry and processes suitable for performing various baseband signal processing operations on receiver signals 217 that are compliant with IEEE 802.11. Wi-Fi processor 250 may include a Wi-Fi radio interface 251 for controlling RxRFE 210 for the purposes of Wi-Fi communications and a Wi-Fi signal processor 252 for extracting Wi-Fi control data and information from raw receiver signals 227. Wi-Fi signal processor 252 may be configured with suitable data processing resources, i.e., hardware or a combination of hardware and software, to process legacy Wi-Fi data, e.g., per IEEE 802.11a/b/g, as illustrated at legacy Wi-Fi process 258, high-throughput (HT) Wi-Fi data, e.g., per IEEE 802.11n, as illustrated at HT Wi-Fi process 256 and very-high-throughput (VHT) Wi-Fi data, e.g., per IEEE 802.11ac, as illustrated at VHT Wi-Fi process 254. The present technique is not limited to any particular implementation of these processes and such will not be described in detail herein in the interest of conciseness.

Wi-Fi radio interface 251 may be configured with signal, data and control processing resources, i.e., hardware or a combination of hardware and software, to control RxRFE 210 for purposes of minimizing errors in Wi-Fi processes 254, 256, 258. Example Wi-Fi radio interface 251 implements a Wi-Fi received signal strength indicator (RSSI) process 257, a Wi-Fi automatic gain control (AGC) process 255 and a Wi-Fi start-of-packet (SOP) process 253. Wi-Fi RSSI process 257 generates an indicator, usually expressed in arbitrary units, as to the signal strength of RF signals 207. Certain embodiments may obtain a direct measurement from the input of RxRFE 210, such as through a calibrated detector. When so embodied, the measurement may be provided to Wi-Fi RSSI process 257 as one or more signals 276a conveyed over Wi-Fi gain control bus 274w, as will be described below. Other embodiments may derive an RSSI from receive signals 227 themselves as provided to Wi-Fi RSSI process 257 on Wi-Fi signal bus 270w. The present technique is not limited to a particular RSSI measurement/computation method. One purpose for determining RSSI is to determine whether electromagnetic energy about antennas 205 is at sufficiently low levels for data transmission from transmitter 180. For example, RSSI may be compared to a threshold below which transmitter 180 is deemed to have a clear channel. An increase in RSSI, e.g., above another threshold, may indicate the presence of new Wi-Fi signals at antennas 205, in which case receiver 140 take measures to accept those signals. RSSI is also used in gain control, as will be described below. Accordingly, certain embodiments may implement continuous monitoring of RSSI or similar parameter, such as received channel power indicator (RCPI).

Wi-Fi SOP process 253 determines whether a valid Wi-Fi frame is being received and, in such case that a Wi-Fi packet is being received, can in a later stage determine the type of frame, i.e., whether the frame is a legacy frame, a HT frame or a VHT frame. The subject technique of this disclosure is not limited to a particular SOP detection methodology, but certain embodiments of the technique do rely on the Wi-Fi frame type determined after Wi-Fi SOP process 253, regardless of the implementation. Accordingly, certain aspects of Wi-Fi SOP process 253 are described herein in relation to other features of the technique, but the bulk of the implementation details of SOP detection will be omitted in the interest of conciseness.

Wi-Fi AGC process 255 generates signals, representatively illustrated as AGC signals 273a, that configure RxPCs 215 to condition the signals processed thereby to suitable signal levels. The subject technique of this disclosure may implement Wi-Fi AGC conventional gain control techniques and is not limited to any particular gain control algorithm. Typically, however, Wi-Fi AGC process 255 may utilize training fields in a standardized IEEE 802.11 Physical Layer Convergence Procedure (PLCP) Protocol Data Unit (PPDU) designed for such purpose. When so embodied, an initial gain may be set and, upon receipt of any signal, Wi-Fi AGC process 255 may adjust the gain in RxPCs 215 in accordance with training data as if it were a Wi-Fi PPDU. Thus, the AGC timing for Wi-Fi processing is established, at least in part, by the length and spacing of the PPDU fields on which gain control is conditioned. AGC timing may depend on other factors as well, such as on expected Peak to Average Ratio (PAR).

The SI processor 240 implements circuitry and processes suitable for performing various baseband signal processing operations on receiver signals 217 for gaining spectral intelligence. SI processor 240 may include an SI radio interface 242 for controlling RxRFE 210 for the purposes of signal analysis and an SI signal processor 243 for performing analyses on raw receive signals 227. For example, SI signal processor 243 may include an spectrum analyzer process 245, by which occupation of various signal channels may be ascertained, and a radar detector process 247, by which the radar operation may be detected and its impact on Wi-Fi channel availability be ascertained. Other analyses may be incorporated as well, essentially without limit. The analysis data are provided to eCCA process 265 and DFS process 266, where signals may be classified and appropriate radio channel allocation procedures be performed.

SI radio interface 242 may include a SI peak detector process 248 that receives detector signals 276b from RxPCs 215 and may perform processing for pulse detection based on signal peaks and duration. SI radio interface 242 may also include an SI AGC process 246 to provide gain control signals 273b to RxPCs for which it has been allocated. Such gain control signals are provided to condition the RF signals in RxPCs 215 for purposes of spectral intelligence analysis.

SI AGC process 246 and Wi-Fi AGC process 255 are completely independent from one another. Accordingly, SI AGC process 246 is not constrained to the same timing requirements as those for Wi-Fi AGC process 255. However, SI AGC process 246 may be under its own constraints, such as to maintain a constant gain in the allocated RxPCs 215 over a particular number of samples so that fast Fourier transforms (FFTs) reflect channel fluctuations and not system fluctuations. For example, SI AGC process 246 may delay attacking an incoming signal and accept coarser gain settings in order to keep the AGC constant for longer intervals, rather than maximizing SNR. SI AGC process 246 may also delay adjusting the gain when a signal is no longer present, to better process signals with shorter training fields than Wi-Fi, or that are amplitude modulated (AM). SI AGC process 246 may also use different constraints on the range of gain values used, and biasing within the gain curves, rather than trying to control the gain in attempts to demodulate extremely weak Wi-Fi packets.

Figure 3:
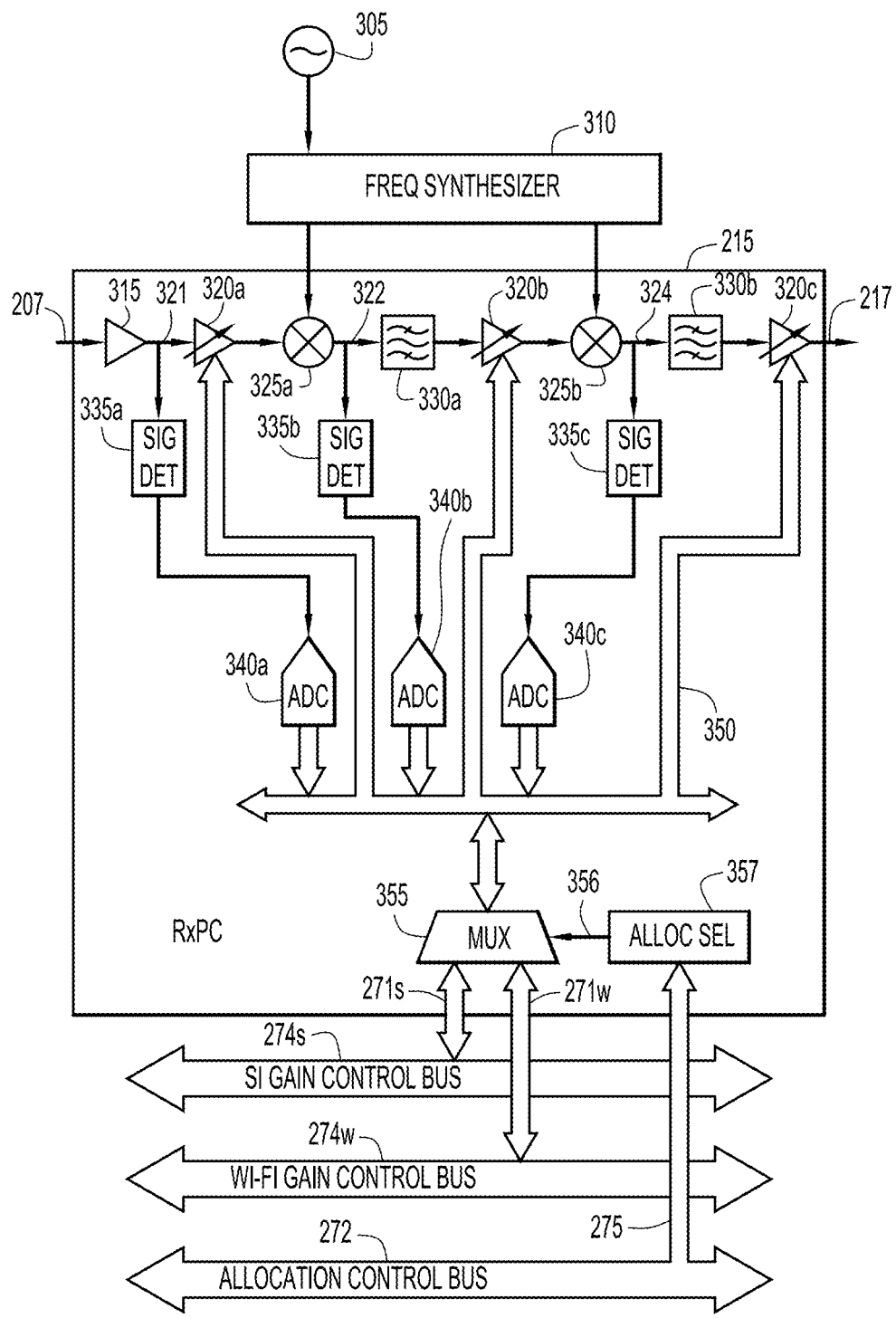
FIG. 3 is a schematic block diagram of an example receiver path circuit in which independent and concurrent AGC can be embodied.

FIG. 3 is a schematic block diagram of an example RxPC 215 with which the subject technique can be embodied. The skilled artisan will recognize RxPC 215 as a superheterodyne circuit, but will recognize that many other receiver circuits may be used with the subject technique. An RF signal 303 may be provided at the input of RxPC 215 where it may be amplified by a low-noise amplifier (LNA) 315. It is to be understood the while LNA is illustrated as a fixed gain amplifier, the subject technique is not so limited. For example, variable gain amplifier (VGA) 320a may be selected in a LNA configuration and amplifier 315 may be omitted. The amplified signal may be down-converted at mixer 325a into an intermediate frequency (IF) signal 322. Thus, mixer 325a may be provided a suitable oscillator signal from frequency synthesizer 310, which may be derived from a system master oscillator 305. Other suitable frequency conversion mechanisms may also be used.

The IF signal from mixer 325a may be bandpass-filtered by filter 330a, amplified by VGA 320b and downconverted to baseband (BB) frequency by mixer 325b, again receiving a suitable oscillator signal from frequency synthesizer 310. The resulting baseband signal 324 may be filtered once again and provided to a final VGA amplifier 320c. A receive signal 307 may then emerge from RxPC 215. It is to be understood that while signals in RxPC 215 are represented by single flow lines, as stated above, the signals may be carried in multiple conductors as quadrature I and Q signal components.

VGAs 320a-320c, representatively referred to herein as VGA(s) 320, may be independently controlled by suitable signals on RxPC bus 350. VGAs 320 may be digitally controlled, i.e., by a digital numeric value provided on RxPC bus 350, or may be controlled by a voltage level provided on RxPC bus 350. The control signals are placed on RxPC bus 350 by multiplexer 355, or similar mechanism that establishes suitable connections with SI gain control bus 274s or Wi-Fi gain control bus 274w, respectively, based on a selection signal 356. Selection signal 356 may be provided by an allocation select circuit 357 that derives the identity of the proper gain control bus 274s, 274w from signals 275 encoded on allocation control bus 272.

RxPC 215 may incorporate one or more signal detectors 335a-335c, representatively referred to herein as signal detectors 335, for measuring signal levels of RF signal 321, IF signal 322 and BB signal, respectively. The technique is not limited to detector type; signal detectors 335 may be configured as signal peak detectors, power detectors, root-mean-square (RMS) detectors, etc., and may generate a voltage proportional to the quantity being measured. The detector voltage may be converted to a digital numeric value by ADCs 340a-340c, representatively referred to herein as ADCs 340, and placed on RxPC bus 350 from which they are transferred to the selected one of SI gain control bus 274s or Wi-Fi gain control bus 274w through multiplexer 355.

In operation, RxPC 215 may be allocated to SI processor 240 or Wi-Fi processor 250 by allocation process 268, which may place appropriate signals 275 for such allocation on allocation control bus 272. Accordingly, multiplexer 355 may be compelled to make connections with either SI gain control bus 274s or Wi-Fi gain control bus 274w, by which SI processor 240 or Wi-Fi processor 250 assumes control over VGAs 320 through signals 271s or 271w. The allocating processor, i.e., SI processor 240 or Wi-Fi processor 250 may also receive signal levels of RF signal 321, IF signal 322 and BB signal 324 from detectors signal 335 through multiplexer 355 and may utilize such signal levels in the corresponding AGC procedure or for other purposes. Meanwhile, receive signal 307, once digitally converted, is directed to SI processor 240 or Wi-Fi processor 250 through RxAS 230 in accordance with the signals 278 from allocation control bus 272. Thus, an AGC control loop is formed for each RxPC 215 through RxAS 230 to the corresponding SI processor 240 and Wi-Fi processor 250 by way of bus 270s or 270w and back to the RxPC 215 from the corresponding SI AGC processor 246 or Wi-Fi AGC processor 255 by way of bus 274s or 274w.

Figure 4:
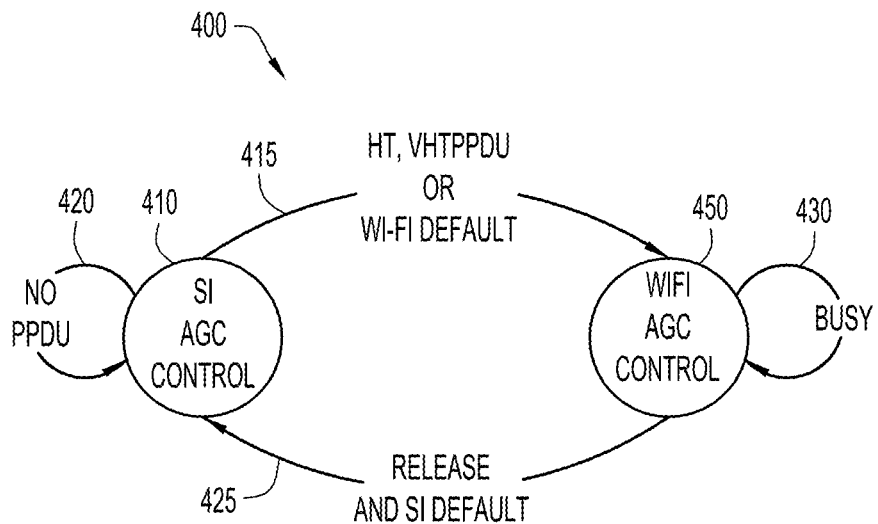
FIG. 4 is a state diagram of an example finite state machine in which the receiver path circuits of FIG. 3 operate independently.

FIG. 4 is a state diagram of a finite state machine (FSM) 400 under which each RxPC 215 may be operated. At any point in time, RxPC 215 may be in an SI AGC control state 410, in which the RxPC 215 is allocated to SI processor 240, or in a Wi-Fi AGC control state 450, in which the RxPC 215 is allocated to Wi-Fi processor 250. Each RxPC 215 may have a designated default state, i.e., one of SI AGC control state 410 or Wi-Fi AGC control state 450, into which it reverts when no other condition prevents such. A transition from SI AGC control state 410 to Wi-Fi AGC control state 450 may occur upon an HT/VHT PPDU detection event 415 (or upon reversion to a default Wi-Fi AGC control state 450). A transition from Wi-Fi AGC control state 450 to SI AGC control state 410 may occur upon a Wi-Fi AGC control release event 425 and the SI AGC control state 410 is the default AGC control state for that particular RxPC 215. Default states for each RxPC 215 in RxRFE 210 may be stored in memory 264 and accessed by allocation process 268.

To exemplify the operation of FSM 400, it is to be assumed that the default state for a particular RxPC 215 is SI AGC control state 410. In this case, RxPC 215 will remain in SI AGC control state 410 as long as no valid PPDU has been detected, as indicated by condition loop 420. During this time, SI processor 240 may perform various analyses on receive signal 217 produced by RxPC 215, including time domain analyses and signal processing for location applications, and will control the gain in RxPC 215 accordingly. Upon a HT/VHT PPDU detection event 415, RxPC 215 is transitioned into the Wi-Fi AGC control state 450. Such transition may be carried out by reallocating the RxPC 215 to Wi-Fi processor 250 by way of allocation process 268 providing suitable signals on allocation control bus 272. While in Wi-Fi AGC control state 450, Wi-Fi processor 250 may perform various Wi-Fi related tasks on receive signal 217 and will control the gain of RxPC 215 accordingly. RxPC 215 may remain in Wi-Fi AGC control state 450 while it is considered busy, as indicated by condition loop 430. Such busy conditions may be that the end-of-packet (EOP) for the currently processed PPDU has not been reached, Wi-Fi MAC process 267 indicates to allocation process 268, such as by signal 288, that a response packet is expected within a short interframe space (SIFS) time, that a full sounding of all channels is to commence or is underway, etc. Once EOP has been detected and no other requirement is preventing such, a release event 425 will compel the RxPC 215 back into SI AGC control state 410. Similar busy conditions may be established for non-HT/VHT cases, such as after sending a Wi-Fi frame for which a response is expected. During the waiting time for the response, Wi-Fi processor 250 may deploy selected mechanisms, such as to sound the channel.

Figure 5:
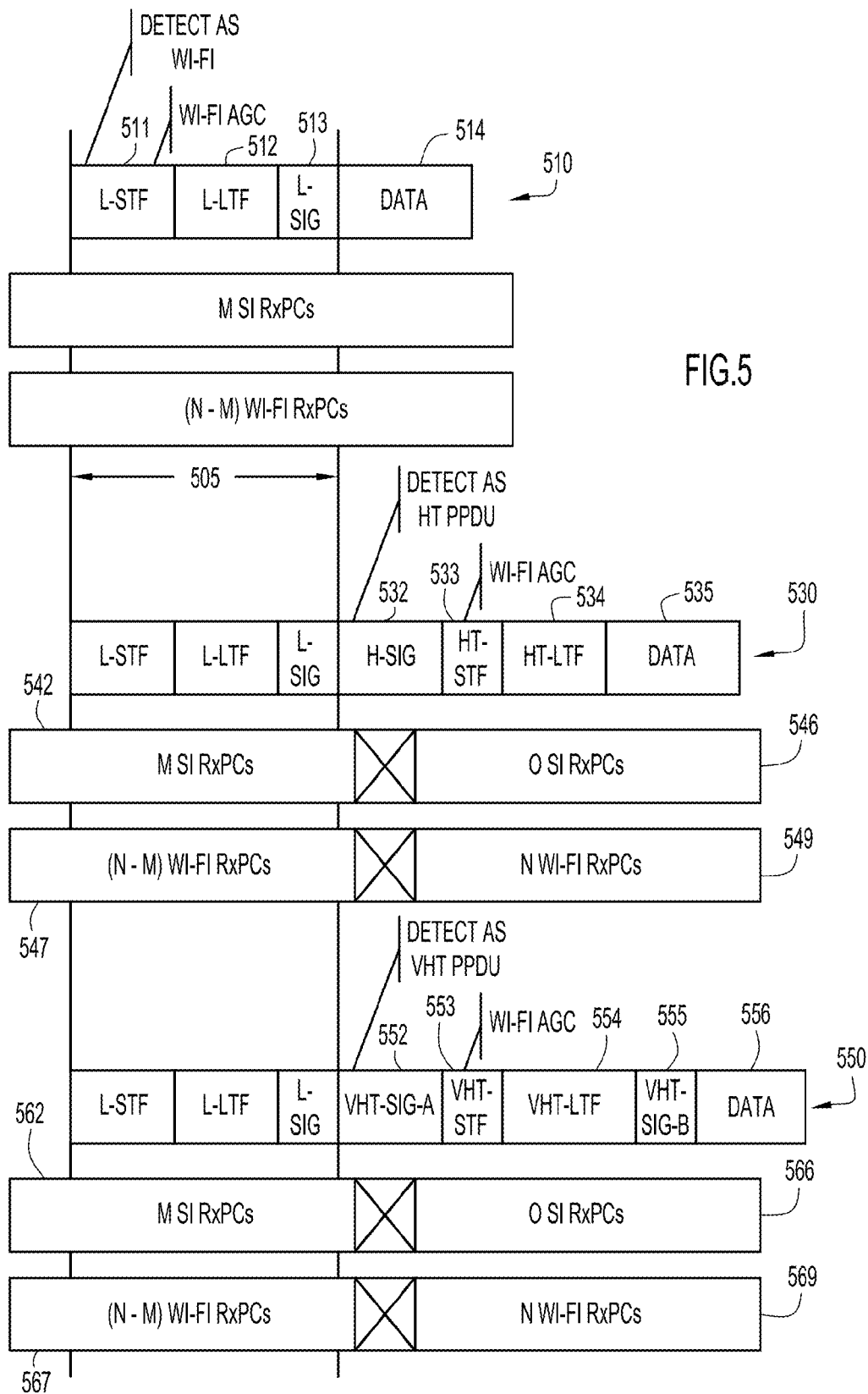
FIG. 5 is a diagram of example Wi-Fi frames aligned with receiver resource allocation and AGC timing in accordance with an embodiment independent and concurrent AGC.

FIG. 5 illustrates receiver resource allocation and gain control timing in view of different Wi-Fi frames being detected. As stated above, Wi-Fi processor 250 identifies Wi-Fi frames as a legacy PPDU, representatively illustrated at legacy PPDU 510, an HT PPDU, representatively illustrated at HT PPDU 530 or a VHT PPDU, representatively illustrated at VHT PPDU 550. All three of these Wi-Fi frames are prefixed with a legacy preamble 505 comprising a legacy short training field (L-STF) 511, a legacy long training field (L-LTF) 512 and a legacy signal field (L-SIG) 513. L-STF 511 contains data for SOP detection, initial frequency offset estimation, time synchronization and data on which Wi-Fi AGC processor 255 can appropriately set the gains of VGAs 320 for purposes of reading the remainder of the Wi-Fi frame. L-LTF 512 includes data for accurate frequency offset estimation, time synchronization, and channel estimation. L-SIG field 513 contains data rate and frame length information. The inclusion of the legacy preamble 505 is for purposes of backward compatibility so that earlier revision level Wi-Fi equipment, e.g., IEEE 802.11a/b/g, can participate in later revision and higher capacity Wi-Fi networks. Data field 514 carries the legacy frame payload.

HT PPDU 530 additionally includes HT-SIG field 532 includes information for interpreting the HT packet format, HT-STF field 533 for improving AGC training for MIMO systems, HT-LTF for estimating channel characteristics between each spatial stream and corresponding receiver circuits and a HT data payload 535. VHT PPDU 550 contains similar information in VHT-SIG-A field 552, VHT-STF 553, and VHT-LTF 554, although for VHT band and constellation configurations, as the HT PPDU counterparts 532, 533 and 534, respectively. VHT PPDU 550 also includes a VHT-SIG-B field 555, which contains information for multiuser mode operation (MU-MIMO) and other information in Length and Tail bits. The payload of VHT PPDU is carried in data field 556. It is to be understood that other frame formats may be used with the subject technique, as will be recognized by the skilled artisan.

As illustrated in FIG. 5, a valid Wi-Fi packet is detected within the first few symbols of legacy preamble 505 and Wi-Fi AGC begins its training by way of L-STF 511. During this time, there may be M RxPCs 215 allocated to SI processor 240, as indicated in allocation block 515, and the remaining (N−M) RxPCs 215 may be allocated to Wi-Fi processor 250, as indicated by allocation block 520. This receiver resource allocation remains in effect unless Wi-Fi processor 250 encounters HT-SIG field 532 or VHT-SIG-A field 552, in which case a HT/VHT event 415, as illustrated in FIG. 4, occurs. When HT-SIG field 532 is encountered, the M RxPCs 215 originally allocated to SI processor 240, as indicated in allocation block 542, are reallocated to Wi-Fi processor 250, as indicated in allocation blocks 546, 547 and 549. Once such reallocation has been completed, Wi-Fi processor 250 has control over all N RxPCs 215 and begins MIMO AGC training on HT-STF 533. Similarly, when VHT-SIG-A field 552 is encountered, the M RxPCs 215 originally allocated to SI processor 240, as indicated in allocation block 562, are reallocated to Wi-Fi processor 250, as indicated in allocation blocks 566, 567 and 569. In this case as well, Wi-Fi processor 250 obtains control over all N RxPCs 215 and begins MIMO AGC training on VHT-STF 553.

Figure 6:
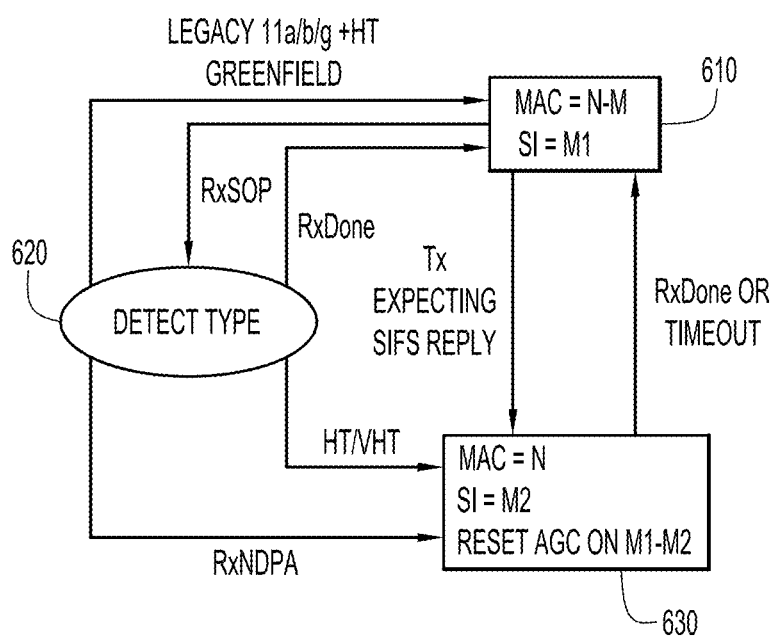
FIG. 6 is a state diagram of a finite state machine depicting arbitration over control/usage of the receiver path circuits between media access control functions and spectrum intelligence functions.

Reference is now made to FIG. 6. FIG. 6 is a state diagram for a state machine 600, and depicting operations of the aforementioned systems as a whole as opposed to for a single receiver path as represented by the state machine in FIG. 4. In this diagram, N is the number of receiver paths, and M is the receiver path(s) that is(are) allocated to the spectrum intelligence function. M1 and M2 are determined by a mode of operation, not a real-time variable. SI refers to spectrum intelligence control. There are 3 states shown in FIG. 6, states 610, 620 and 630. In state 610, the spectrum intelligence function is using M1 receiver paths, and the MAC process is using the rest of the receiver paths not used by spectrum intelligence function, that is (N−M1). State 620 is an interim state that involves constant detection of start of a packet (RxSOP). State 630 is a state in which the MAC process is given control over additional receiver paths and the spectrum intelligence function has control over fewer receiver paths, or none of the receive paths should M2 be an empty set.

In operation, state 620 is constantly running to determine when start of packet (RxSOP) occurs, and then determines the type of a packet, and in particular whether a HT/VHT packet is received. When an HT/VHT packet is received, a transition is made to state 630 (as indicated by the arrow labeled HT/VHT) in which case the MAC process is given control over additional receiver paths M1-M2 and spectrum intelligence retains control over M2 receiver paths. In step 630, the AGC is reset on the receiver path(s) M1-M2 that the spectrum intelligence was using/controlling. A transition also occurs to state 630 from state 620 when some other received packets are detected, such as a sounding announcement packet, so that the MAC process can use/take control of the M1-M2 receiver paths again. This is represented by RxNDPA (receive null data packet announcement) while in state 620. A transition from state 620 to state 610 may occur when packet reception is complete (as indicated by RxDone in the figure) or it is otherwise desired to return control of M1 receiver paths to spectrum intelligence.

There may be times when no reception is occurring but after a transmission (Tx), a reply could be expected within an SIFS time period for which implicit sounding is desired. In that case, control of the M1-M2 receive paths needs to be returned back to the MAC process and thus a transition is made to state 620 from state 630, as indicated by arrow labeled Tx expected SIFS reply. After the reply is received or some time-out occurs, control over the M1-M2 receiver paths can be returned back to the spectrum intelligence function as shown by the arrow labeled RxDone or Timeout.

FIG. 6 also shows a loop back from state 620 to state 610, by arrow labeled Legacy 11a/b/g+HT Greenfield. This is to account for occurrence of a legacy 802.11a/b/g signal and/or devices that operate in accordance with the 802.11 HT (also known as Greenfield) mode.

In summary, a method is provided comprising allocating, from a plurality of receiver path circuits coupled to one or more receive antennas of a wireless receiver, a first set of receiver path circuits for processing a radio-frequency (RF) signal from the receive antennas into a first receive signal of a first signal class; applying a first gain control signal to each of the allocated receiver path circuits to condition a signal level of the RF signal for the processing thereof into the first receive signal; applying a second gain control signal to a second set of receiver path circuits to condition the signal level of the RF signal for processing thereof into a second receive signal of a second signal class distinct from the first signal class; reallocating the receiver path circuits in response to a determination from either of the first and second receive signals that a corresponding one of the first and second signal classes is a wireless communication signal class associated with a wireless network protocol and the corresponding first and second receive signals is a wireless communication signal; and modifying the first or second gain control signal applied to the reallocated receiver path circuits to optimize the signal level of the RF signal for processing thereof into the communication signal.

The first gain control signal may be generated independently of the second gain control signal. Furthermore, the first gain control signal may be generated in accordance with training data contained in the RF signal, and the second gain control signal generated exclusively of the training data.

The first receive signal may be converted (downconverted) into a baseband signal that can be processed in accordance with the wireless network protocol, and the second receive signal is processed exclusively of requirements of the wireless network protocol. That is, the processing of the second receive signal involves performing spectral intelligence processing on the second receive signal.

Moreover, the method may further involve determining from the wireless communication signal processed by the reallocated set of receiver path circuits that the RF signal can be classified into a second wireless communication signal class; reallocating the receiver path circuits for processing the RF signal of the second wireless communication signal class; and applying a fourth gain control signal to the reallocated receiver path circuits to optimize the signal level of the RF signal for processing thereof into the second wireless communication signal class. As explained in the various examples herein, the wireless communication signal class is an IEEE 802.11 signal class and the second wireless communication signal class is a high-throughput (HT) IEEE 802.11 signal class or a very-high-throughput (VHT) signal class. The method may further involve detecting an indication of an end-of-packet in the receiver signal generated from the RF signal of the second wireless communication signal class; reallocating the set of receiver path circuits into the first and second sets of receiver path circuits; applying the first gain control signal to each of the first set of receiver path circuits to condition the signal level of the RF signal for processing into the first receive signal; and applying the second gain control signal to the second set of receiver path circuits to condition the signal level of the RF signal for processing into the second receive signal. When an indication is received that another receive signal of the wireless communication signal class is expected on an RF signal within a time interval, the reallocating of the receiver path circuits into the first and second sets of receiver path circuits is postponed for at least the time interval.

In one variation, the reallocating of the set of receiver path circuits may involve resetting the first or second gain control signal to a predetermined signal state for any of the receiver path circuits reallocated to process the RF signal into the communication signal; allocating the receiver path circuits for which the first or second gain control signal was reset to process the RF signal into the communication signal; and applying the third gain control signal to the receiver path reallocated to process the RF signal into the communication signal.

In another variation, the reallocating of the receiver path circuits involves reallocating all receiver path circuits in the wireless receiver to process the RF signal into the communication signal.

Similarly, an apparatus is provided comprising a set of one or more receive antennas to detect a radio frequency (RF) signal; a plurality of receiver path circuits coupled to the receive antennas to independently process the RF signal into one or more receive signals; a plurality of control loop circuits to convey automatic gain control (AGC) signals to and from each of the receiver path circuits; and a processor coupled to the plurality of receiver path circuits and to plurality of control loop circuits. The processor is configured to: allocate a first set of receiver path circuits for processing the RF signal into a first receive signal of a first signal class; apply a first gain control signal to each of the allocated receiver path circuits to condition a signal level of the RF signal for the processing thereof into the first receive signal;

apply a second gain control signal to a second set of receiver path circuits to condition the signal level of the RF signal for processing thereof into a second receive signal of a second signal class distinct from the first signal class; reallocate the receiver path circuits in response to a determination from either of the first and second receive signals that a corresponding one of the first and second signal classes is a wireless communication signal class associated with a wireless network protocol and the corresponding first and second receive signals is a wireless communication signal; and modify the first or second gain control signal applied to the reallocated receiver path circuits to optimize the signal level of the RF signal for processing thereof into the communication signal.

Furthermore, a tangible, non-transitory computer-readable medium is provided having instructions encoded thereon that, when executed by a processor, configure the processor to: allocate, from a plurality of receiver path circuits coupled to one or more receive antennas of a wireless receiver, a first set of receiver path circuits for processing a radio-frequency (RF) signal from the receive antennas into a first receive signal of a first signal class; apply a first gain control signal to each of the allocated receiver path circuits to condition a signal level of the RF signal for the processing thereof into the first receive signal; apply a second gain control signal to a second set of receiver path circuits to condition the signal level of the RF signal for processing thereof into a second receive signal of a second signal class distinct from the first signal class; reallocate the receiver path circuits in response to a determination from either of the first and second receive signals that a corresponding one of the first and second signal classes is a wireless communication signal class associated with a wireless network protocol and the corresponding first and second receive signals is a wireless communication signal; and modify the first or second gain control signal applied to the reallocated receiver path circuits to optimize the signal level of the RF signal for processing thereof into the communication signal.

Described above are examples. The concepts described herein may be embodied in other specific forms without departing from the spirit or essential characteristics thereof. The foregoing examples are therefore to be considered in all respects illustrative and not meant to be limiting. Accordingly, it is intended to embrace all such alterations, modifications and variations that fall within the spirit and scope of any claims filed in applications claiming priority hereto interpreted in accordance with the breadth to which they are fairly, legally and equitably entitled.

What is claimed is:

1. A method comprising:
   allocating, from a plurality of receiver path circuits coupled to one or more receive antennas of a wireless receiver, (i) a first set of the receiver path circuits for processing a radio-frequency (RF) signal from the receive antennas into a first receive signal of a first signal class, and (ii) a second set of the receiver path circuits for processing the RF signal into a second receive signal of a second signal class distinct from the first signal class;
   first processing the first receive signal according to a wireless network protocol;
   second processing the second receive signal exclusively of requirements of the wireless network protocol;
   generating a first gain control signal in accordance with training data according to the wireless network protocol contained in the RF signal, and applying the first gain control signal to the first set of the receiver path circuits to condition a signal level of the RF signal for the processing thereof into the first receive signal;
   generating a second gain control signal independently of generating the first gain control signal and exclusively of the training data according to the wireless network protocol, and applying the second gain control signal to the second set of the receiver path circuits to condition the signal level of the RF signal for processing thereof into the second receive signal;
   reallocating at least some of the second set of the receiver path circuits to the first set of the receiver path circuits in response to a determination from the first processing that the first signal class is a wireless communication signal class associated with the wireless network protocol and the first receive signal is a wireless communication signal; and
   modifying the first or second gain control signal applied to reallocated receiver path circuits to optimize the signal level of the RF signal for processing thereof into the first receive signal that is determined to be the wireless communication signal.

2. The method of claim 1, further comprising:
   converting the first receive signal into a baseband signal wherein the first processing includes processing the baseband signal according to the wireless network protocol.

3. The method of claim 2, wherein the second processing comprises performing spectral intelligence processing on the second receive signal.

4. The method of claim 1, further comprising:
   determining from the wireless communication signal processed by the reallocated set of receiver path circuits that the RF signal can be classified into a second wireless communication signal class;
   reallocating at least some of the second set of the receiver path circuits for processing the RF signal of the second wireless communication signal class; and
   applying a third gain control signal to the reallocated receiver path circuits to optimize the signal level of the RF signal for processing thereof into the second wireless communication signal class.

5. The method of claim 4, wherein the wireless communication signal class is an IEEE 802.11 signal class and the second wireless communication signal class is a high-throughput (HT) IEEE 802.11 signal class or a very-high-throughput (VHT) signal class.

6. The method of claim 4, further comprising:
   detecting an indication of an end-of-packet in the receiver signal generated from the RF signal of the second wireless communication signal class;
   reallocating at least some of the first set of the receiver path circuits into the second set of the receiver path circuits;
   applying the first gain control signal to the first set of the receiver path circuits to condition the signal level of the RF signal for processing into the first receive signal; and
   applying the second gain control signal to the second set of the receiver path circuits to condition the signal level of the RF signal for processing into the second receive signal.

7. The method of claim 1, wherein reallocating comprises:
   resetting the first or second gain control signal to a predetermined signal state for any of the receiver path circuits reallocated to process the RF signal into the wireless communication signal;

allocating the receiver path circuits for which the first or second gain control signal was reset to process the RF signal into the wireless communication signal; and applying the third gain control signal to the receiver path reallocated to process the RF signal into the wireless communication signal.

8. The method of claim 1, wherein reallocating comprises reallocating all of the set of the second receiver path circuits in the wireless receiver to process the RF signal into the wireless communication signal.

9. The method of claim 1, wherein:
the first processing includes first processing, by a Wi-Fi processor, the first receive signal according to the wireless network protocol; and
the second processing includes second processing, by a spectrum intelligence processor, the second receive signal exclusively of the requirements of the wireless network protocol.

10. An apparatus comprising:
a set of one or more receive antennas to detect a radio frequency (RF) signal;
a plurality of receiver path circuits coupled to the receive antennas to independently process the RF signal into one or more receive signals;
a plurality of control loop circuits to convey automatic gain control (AGC) signals to and from each of the receiver path circuits; and
a processor coupled to the plurality of receiver path circuits and to plurality of control loop circuits, and configured to:
allocate (i) a first set of the receiver path circuits for processing the RF signal into a first receive signal of a first signal class, and (ii) a second set of the receiver path circuits for processing the RF signal into a second receive signal of a second signal class distinct from the first signal class;
first process the first receive signal according to a wireless network protocol;
second process the second receive signal exclusively of requirements of the wireless network protocol;
generate a first gain control signal in accordance with training data according to the wireless network protocol contained in the RF signal, and apply the first gain control signal to the first set of the receiver path circuits to condition a signal level of the RF signal for the processing thereof into the first receive signal;
generate a second gain control signal independently of generating the first gain control signal and exclusively of the training data according to the wireless network protocol, and apply a second gain control signal to the second set of the receiver path circuits to condition the signal level of the RF signal for processing thereof into the second receive signal;
reallocate at least some of the second set of the receiver path circuits to the first set of the receiver path circuits in response to a determination from the first processing that the first signal class is a wireless communication signal class associated with the wireless network protocol and the first receive signal is a wireless communication signal; and
modify the first or second gain control signal applied to reallocated receiver path circuits to optimize the signal level of the RF signal for processing thereof into the first receive signal that is determined to be the wireless communication signal.

11. The apparatus of claim 10, wherein the processor is further configured to:

determine from the wireless communication signal processed by the reallocated set of receiver path circuits that the RF signal can be classified into a second wireless communication signal class;
reallocate at least some of the second set of the receiver path circuits for processing the RF signal of the second wireless communication signal class; and
apply a third gain control signal to the reallocated receiver path circuits to optimize the signal level of the RF signal for processing thereof into the second wireless communication signal class.

12. The apparatus of claim 10, wherein the wireless communication signal class is an IEEE 802.11 signal class and the second wireless communication signal class is a high-throughput (HT) IEEE 802.11 signal class or a very-high-throughput (VHT) signal class.

13. The apparatus of claim 10, wherein the processor is further configured to:
detect an indication of an end-of-packet in the receiver signal generated from the RF signal of the second wireless communication signal class;
reallocate at least some of the first set of the receiver path circuits into the second set of the receiver path circuits;
apply the first gain control signal to the first set of the receiver path circuits to condition the signal level of the RF signal for processing into the first receive signal; and
apply the second gain control signal to the second set of the receiver path circuits to condition the signal level of the RF signal for processing into the second receive signal.

14. The apparatus of claim 13, wherein the processor is further configured to:
receive an indication that another receive signal of the wireless communication signal class is expected on an RF signal within a time interval;
postpone the reallocating of the receiver path circuits into the first and second sets of the receiver path circuits for at least the time interval.

15. The apparatus of claim 10, wherein the processor further includes:
a Wi-Fi processor configured to perform the first process operation; and
a spectrum intelligence processor configured to perform the second process operation.

16. A tangible, non-transitory computer-readable medium having instructions encoded thereon that, when executed by a processor, configure the processor to:
allocate (i) a first set of the receiver path circuits for processing the RF signal into a first receive signal of a first signal class, and (ii) a second set of the receiver path circuits for processing the RF signal into a second receive signal of a second signal class distinct from the first signal class;
first process the first receive signal according to a wireless network protocol;
second process the second receive signal exclusively of requirements of the wireless network protocol;
generate a first gain control signal in accordance with training data according to the wireless network protocol contained in the RF signal, and apply the first gain control signal to the first set of the receiver path circuits to condition a signal level of the RF signal for the processing thereof into the first receive signal;
generate a second gain control signal independently of generating the first gain control signal and exclusively of the training data according to the wireless network protocol, and apply a second gain control signal to the second set of the receiver path circuits to condition the signal level of the RF signal for processing thereof into the second receive signal;

reallocate at least some of the second set of the receiver path circuits to the first set of the receiver path circuits in response to a determination from the first processing that the first signal class is a wireless communication signal class associated with the wireless network protocol and the first receive signal is a wireless communication signal; and modify the first or second gain control signal applied to reallocated receiver path circuits to optimize the signal level of the RF signal for processing thereof into the first receive signal that is determined to be the wireless communication signal.

17. The computer-readable medium of claim 16, having further instructions encoded thereon that, when executed by the processor, configure the processor to:

determine from the wireless communication signal processed by the reallocated set of receiver path circuits that the RF signal can be classified into a second wireless communication signal class;

reallocate at least some of the second set of the receiver path circuits for processing the RF signal of the second wireless communication signal class; and apply a third gain control signal to the reallocated receiver path circuits to optimize the signal level of the RF signal for processing thereof into the second wireless communication signal class.

18. The computer-readable medium of claim 16, wherein the instructions further comprise instructions to cause the processor to:

perform the first process operation by a WiFi processor; and perform the second process operation by a spectrum intelligence processor.

* * * * *